Figure 1:
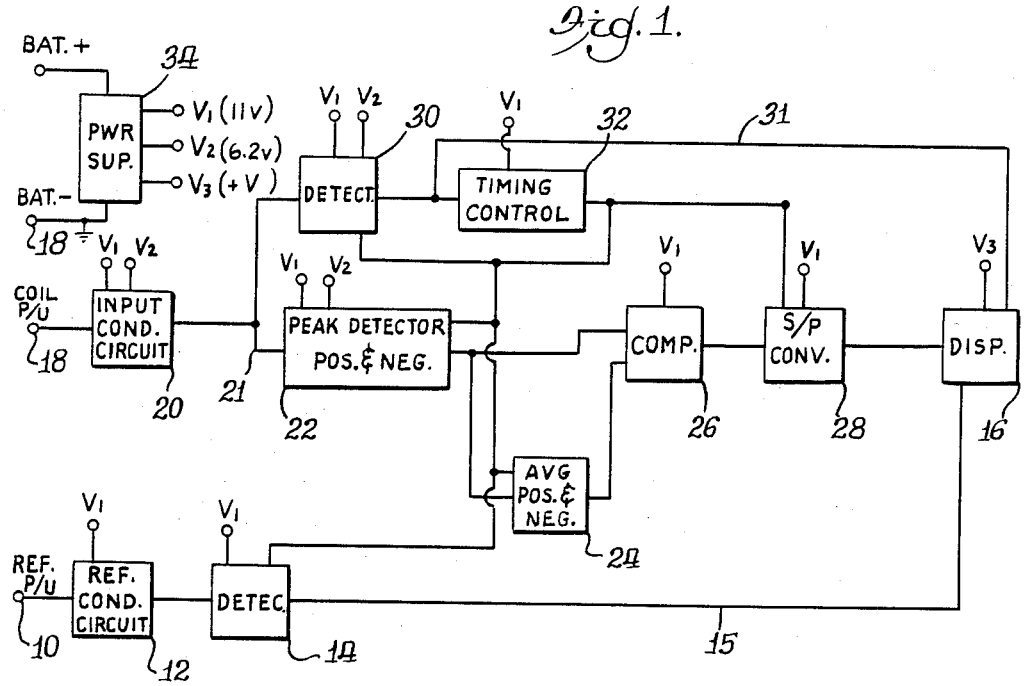

United States Patent [19]
Koehl et al.

[11] Patent Number: 4,558,280
[45] Date of Patent: Dec. 10, 1985

[54] IGNITION SECONDARY ANALYZER

[75] Inventors: Stephen E. Koehl, Geneva; Charles R. Tiller, Glenview, both of Ill.

[73] Assignee: Cooper Industries, Inc., Houston, Tex.

[21] Appl. No.: 481,391

[22] Filed: Apr. 1, 1983

[51] Int. Cl.$^4$ .................... G01R 15/08; G01R 15/04; F02P 17/00
[52] U.S. Cl. ................ 324/399; 364/431.03
[58] Field of Search .................... 324/399, 378; 364/431.03, 431.05

[56] References Cited

U.S. PATENT DOCUMENTS

| | | |
|---|---|---|
| 3,740,642 | 6/1973 | Taylor . |
| 3,743,922 | 7/1973 | Festos . |
| 3,793,584 | 2/1974 | Liebermann et al. . |
| 3,942,102 | 3/1976 | Kuhn ............... 324/399 |
| 3,961,240 | 6/1976 | Pohl ................ 324/399 |
| 3,984,768 | 10/1976 | Staples . |
| 4,204,152 | 5/1980 | Imrie . |
| 4,305,038 | 12/1981 | Luzynski . |
| 4,449,100 | 5/1984 | Johnson ............ 324/399 X |

FOREIGN PATENT DOCUMENTS 2335539 6/1975 Fed. Rep. of Germany ...... 324/378

Primary Examiner—Stanley T. Krawczewicz
Assistant Examiner—Jose M. Solis
Attorney, Agent, or Firm—Fitch, Even, Tabin & Flannery

[57] ABSTRACT

The secondary ignition circuit of a spark ignited internal combustion engine is analyzed to identify the location of faulty portions of the circuit, the circuit having an induction coil for generating sparking voltage pulses repetitively, and a distributor for cyclically distributing the voltage pulses to respective spark plugs in a predetermined order. The peak amplitude of respective voltage pulses of one polarity developed at a single point in the secondary ignition circuit for respective spark plugs in each engine cycle is measured to produce measurement signals systematically related thereto. A comparison signal is derived that is systematically related to the average peak amplitude of voltage pulses of the one polarity developed for all spark plugs. Successive measurement signals are compared with the comparison signal, and a fault is indicated when a measurement signal differs from the comparison signal by more than a predetermined differential. A fault is also indicated when the measurement signal is less than a predetermined amplitude. A fault is also indicated when peak voltage pulses of the opposite polarity exceed the average peak by more than a predetermined differential. The spark plugs at fault are individually identified, as is the nature of the fault.

29 Claims, 4 Drawing Figures

IGNITION SECONDARY ANALYZER

This invention relates to apparatus for analyzing the operation of the ignition of an internal combustion engine to identify faults, and more particularly to handheld apparatus using a single pickup on the ignition secondary to measure the voltage distributed to each of the spark plugs, and to identify the location of defects.

Ignition secondary analyzers for internal combustion engines have been developed which identify faulty spark plugs and other faults in the secondary circuit while the engine is running, without removing the plugs. Some analyzers are portable or handheld and measure the voltage on one spark plug at a time. Testing is time-consuming with such analyzers, however, because a single connection must be moved from spark plug wire to spark plug wire to make each measuement. Other analyzers continuously measure to voltage of the entire secondary ignition circuit and display it on an oscilloscope. Such devices are generally bulky, require an external power source such as line current, and do not identify the location of the portions of the secondary circuit which are defective.

Thus, there is a need for handheld ignition secondary analyzers which use a single pickup connected to the ignition coil output lead to measure the voltage on each of the respective spark plugs successively, and process the information obtained to identify and display the location of faults. There is also a need for such analyzers which also identify and display the nature of faults which are detected.

In keeping with one aspect of this invention, apparatus is provided for analyzing the secondary ignition voltage of an internal combustion engine. One pickup is connected to a selected spark plug to identify a reference cylinder, and another pickup is connected to the high voltage output of the coil for measuring successive coil outputs. A reference voltage is established by measuring several outputs of the coil and approximately averaging the measurements. The voltage distributed to successive spark plugs is compared to the average, and data are generated which reflect the relative condition of each portion of the secondary circuit, including the respective spark plugs, in relation to the other portions of the circuit. The data are stored in a shift register, and each output voltage is appropriately averaged with the reference voltage after it is stored. When a coil output is distributed to the spark plug in the reference cylinder, the pickup attached to that spark plug causes the data in the shift register to be read out and displayed to indicate which, if any, spark plugs or other portions of the circuit are faulty. After the read-out, the shift register is reset to begin receiving new data. The types of faults detected may also be displayed, if desired.

Accordingly, one aspect of this invention is to provide new and improved circuitry for analyzing the ignition circuits of an internal combustion engine.

Another aspect is to provide a new and improved handheld secondary circuit analyzer which uses a single pickup on the coil output of the ignition secondary to measure successive outputs of the coil, and processes the information obtained to identify the location of defective portions of the secondary circuit, including faulty spark plugs.

Still another aspect is to provide a new and improved handheld secondary circuit analyzer which uses a single pickup on the output lead of the ignition secondary circuit to measure successive outputs of the coil, and processes the information obtained to identify the nature of faults in the secondary circuit.

Figure 3:
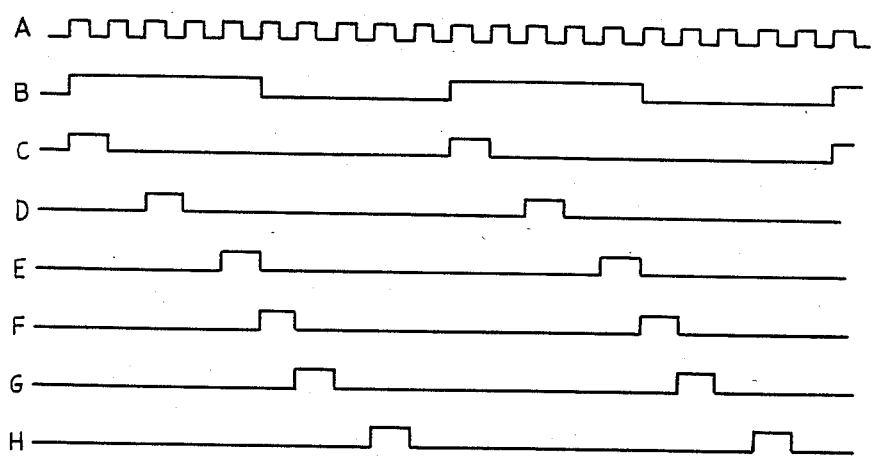
Figure 2A:
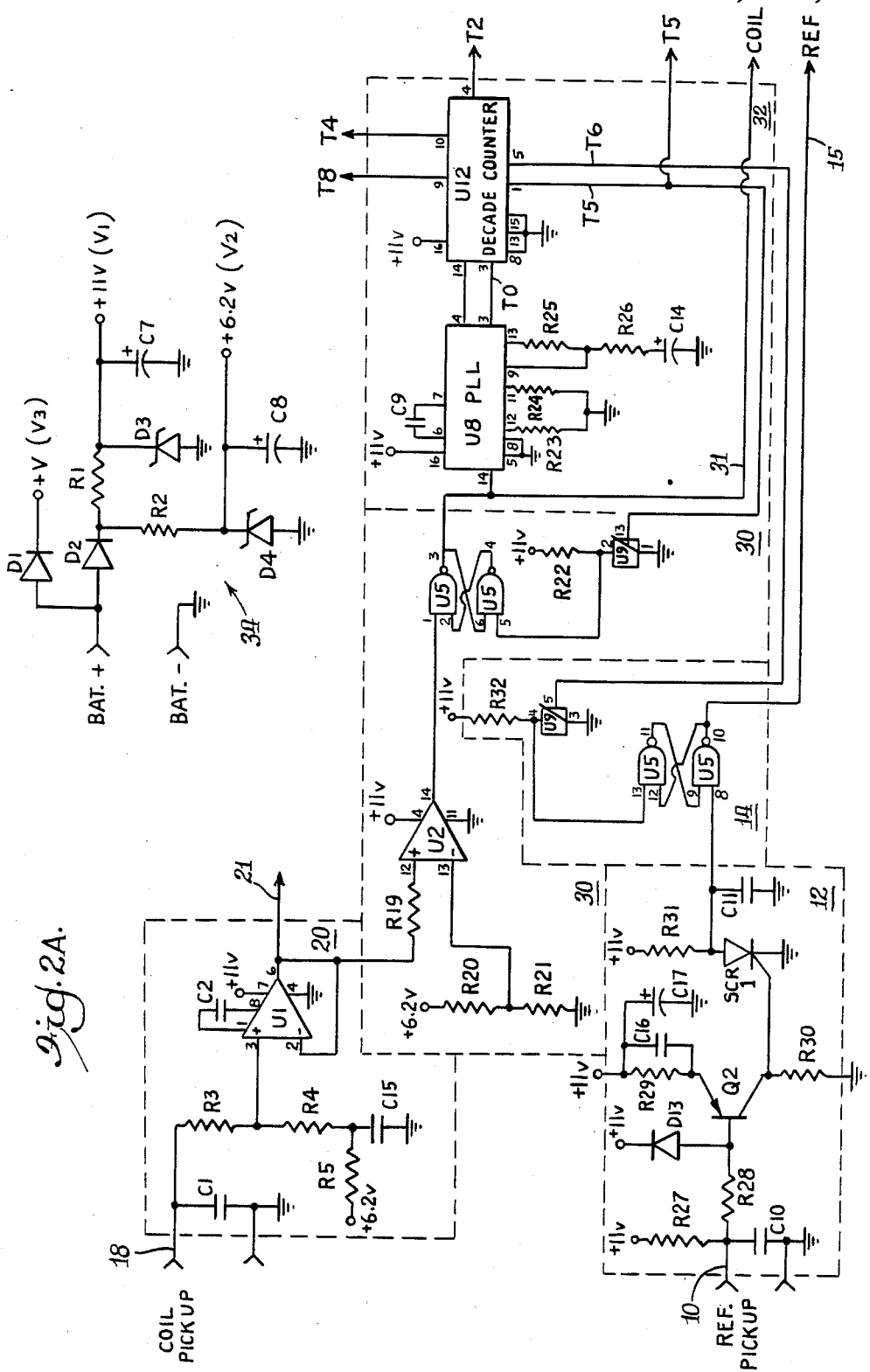
Figure 2B:
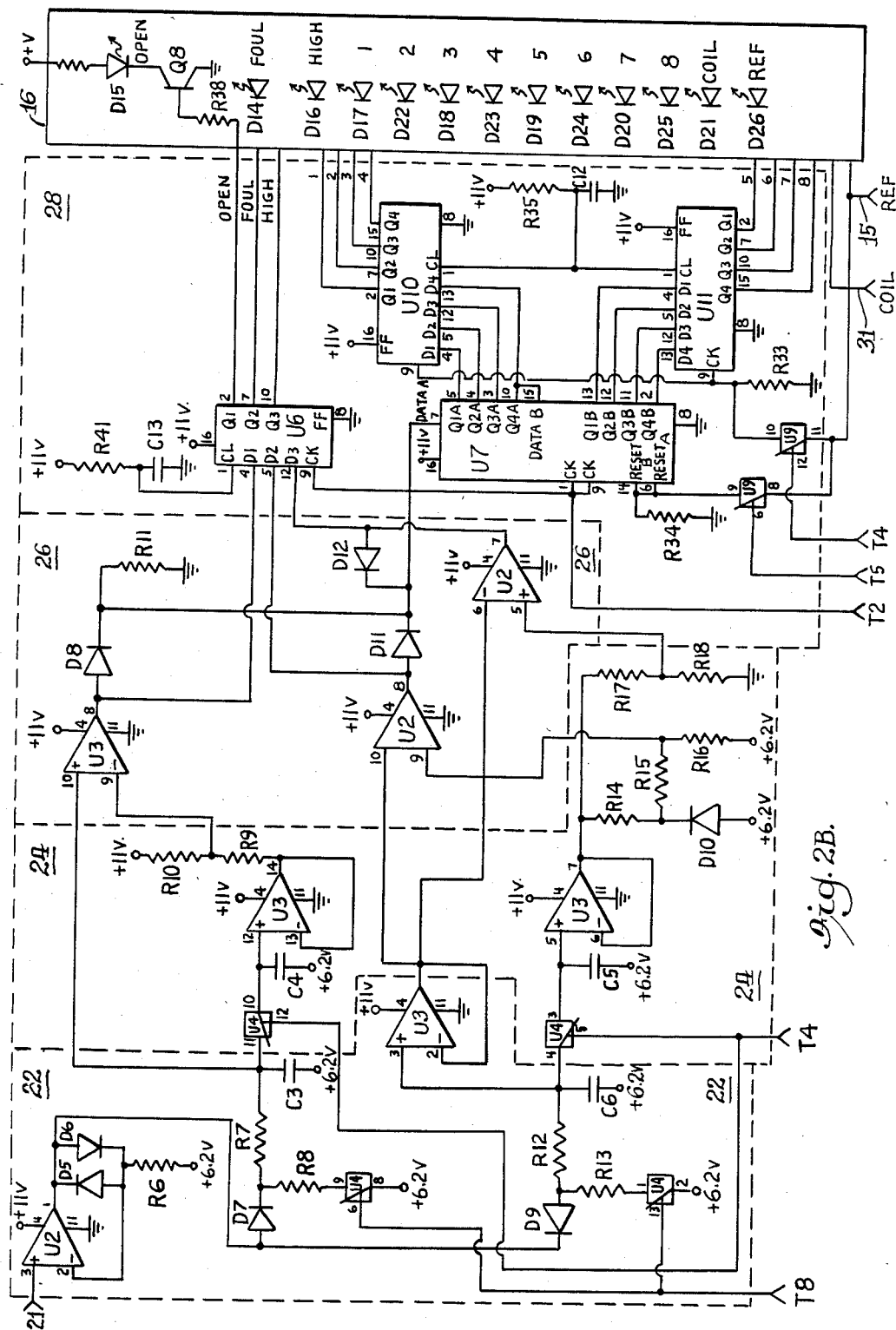

These and other aspects and features of the present invention, and the manner of obtaining them will become more apparent, and the invention may be best understood by reference to the following detailed description of preferred embodiments, particularly when taken in conjunction with the accompanying drawing, in which:

FIG. 1 is a block diagram of one form of analyzer in accordance with the present invention:

FIGS. 2A and 2B comprise a more detailed circuit diagram of the analyzer shown in FIG. 1; and FIG. 3 is a timing diagram for timing the operation of the analyzer shown in FIG. 1.

The embodiment of the circuit of this invention shown schematically in FIG. 2 analyzes the secondary ignition circuit of an internal combustion engine (not shown) having up to eight cylinders. The secondary circuit typically includes breaker points which close and open at predetermined times as the crankshaft of the engine rotates, or electronic ignition means which perform the same function, and a coil which generates a high voltage output each time the points open. Each coil output voltage is distributed to a selected portion of the secondary circuit, notably to a respective spark plug, for the purpose of producing an ignition arc across the respective spark plug gap.

Each spark plug generates an arc within an specified coil output voltage range when the spark plug and related portion of the secondary circuit are operating properly. If the spark plug is fouled, however, its effective resistance is lower than normal, and the coil output may be discharged at a relatively low voltage. If the spark plug gap is too wide, or the effective resistance is high due to some other fault in the circuit, the output voltage may be high when the arc is produced. If an open circuit develops in a portion of the circuit which prevents an arc from forming, the coil produces a high output of reverse polarity. Thus, by measuring the outputs of the coil as they are distributed to the various spark plugs, the condition of each circuit portion may be evaluated, and certain types of faults in each portion of the circuit may be identified.

The present invention identifies faulty portions of the secondary circuit, including the spark plugs, by comparing each successive coil output voltage to the approximate average of the voltages distributed to all of the spark plugs. If the voltage is sufficiently higher than the average, a wide gap or other condition causing high resistance is indicated, and if the voltage has a sufficient reverse polarity component, an open circuit is identified. If a low voltage appears on a particular spark plug, a fouled spark plug is identified. Binary data indicating the condition of each spark plug are stored and displayed so that the location of faulty portions of the secondary circuit may be identified. The nature of faults detected may also be displayed, if desired.

A capacitive or other suitable pickup (not shown) is connected to a selected reference spark plug. The reference pickup is electrically connected to a reference terminal 10. The voltage generated in the pickup is processed in a reference conditioning circuit 12 connected thereto. The conditioning circuit 12 attenuates the ignition pulses by resistive and capacitive elements and provides corresponding output pulses of suitable size and shape. The output pulses are applied to a detector 14 where they set a flip-flop U5-8, 9, 10, 11, 12, 13 to provide a circuit reference to indicate that the reference cylinder spark plug has just fired. The reference signal (REF) is applied over a line 15 to a display 16 where an LED D26 illuminates when the flip-flop is set, and turns off when the flip-flop is reset.

Another pickup (the coil pickup) is electro-magnetically coupled to the secondary of the ignition coil. That pickup generates a voltage applied at a terminal 18 to an input conditioning circuit 20 which operates to attenuate the input signals from about 20–40 kv. to about 3 volts. The conditioned signals are output through a high impedance buffer amplifier U1-2, 3, 6 on a line 21.

Under normal operating conditions, a conventional ignition coil produces negative voltage pulses on its secondary for application to respective spark plugs. If a portion of the circuit is open, the coil produces a pulse having a substantial positive component. The analyzer of the present invention as shown in FIGS. 1 and 2 measures both negative and positive components, utilizing a peak detector circuit 22. The conditioned signals from the input conditioning circuit 20 are applied through a buffer amplifier U2-1, 2, 3 and diodes D7 and D9 to respective peak hold capacitors C3 and C6. The buffer amplifier U2-1, 2, 3 acts to eliminate the diode offset voltage from the respective peak hold capacitors C3 and C6. This is by reason of the respective feedbacks through diodes D5 and D6. For example, with positive excursions, the voltage at U2-1 tries to force the inverting input pin U2-2 to the voltage on the non-inverting input pin U2-3 through the diode D6. This requires the potential on pin U2-1 to be one diode drop greater than the potentials on pins U2-2 and U2-3. As this same potential on pin U2-1 is applied through the diode D7 with its attendant diode drop, the capacitor C3 is charged to the positive peak potential on pin U2-3. Positive peaks are held on the capacitor C3 and negative peaks on the capacitor C6.

A positive reference voltage which is functionally related to the average of the voltages on the capacitor C3 is stored on a capacitor C4 of an averaging circuit 24, and a negative reference voltage which is functionally related to the average of the voltage on the capacitor C6 is stored on a capacitor C5 of the averaging circuit 24. The average voltage on the capacitor C4 is established and maintained by momentarily closing the normally open contacts of a transistor or other suitable switch U4-10, 11, 12 to connect the capacitor C3 in parallel with the capacitor C4. If the voltage on the capacitor C3 is higher than that on the capacitor C4, the voltage on the capacitor C4 will be raised somewhat. If the voltage on the capacitor C3 is lower, the voltage on the capacitor C4 will decrease. A switch U4-6, 8, 9 momentarily closes and then opens after the switch U4-10, 11, 12 opens to remove residual charge from the capacitor C3 so that the capacitor C3 may properly measure the next output of the buffer U2-1, 2, 3.

In operation, a positive voltage excursion is applied through the diode D7 to the storage capacitor C3 with switches U4-6, 8, 9 and U4-10, 11, 12 open, the capacitor having been previously discharged by the prior closing of the switch U4-6, 8, 9. The capacitor C3, thus, is charged substantially to the potential of the most positive voltage excursion since the capacitor was last discharged. The potential reached and held on the capacitor C3 is thus the peak positive potential corresponding to each respective output of the coil pickup. The capacitance of the capacitor C3 is about an order of magnitude less than the capacitance of the capacitor C4. Hence, when the switch U4-10, 11, 12 is closed momentarily, charge passes from one to the other capacitor to equalize the potentials to a weighted average, weighted in favor of the larger capacitor previously charged by earlier positive signal pulses. The switch U4-10, 11, 12 is then opened to isolate the capacitor C4 to store the average potential. The switch U4-6, 8, 9 is then momentarily closed to discharge the capacitor C3 and then opened preparatory to receiving another positive signal through the diode D7.

The capacitance of the capacitor C4 is weighted with respect to the capacitance of the capacitor C3 so that after serval coil output voltages are measured and stored on the capacitor C4, the voltage on the capacitor C4 is functionally related to the average of the positive voltage excursions of the outputs of the buffer U2-1, 2, 3. Preferred capacitances are about 1500 pf for the capacitor C3 and about 10,000 pf for the capacitor C4.

The approximate average voltage on the capacitor C5 is established and maintained in a similar manner by properly operating switches U4-3, 4, 5 and U4-1, 2, 13. The capacitor C6 may be about 1500 pf, and the capacitor C5 may be about 10,000 pf to achieve an acceptable functional relationship. The manner in which the opening and closing of the switches U4-3, 4, 5, U4-10, 11, 12, U4-1, 2, 13 and U4-6, 8, 9 are timed will be described below. Such switches may in the circuit shown be in the form of a CD4016BE quad bilateral switch.

Each time the buffer U2-1, 2, 3 produces an output, the voltages on the capacitors C3 and C4 are compared in a comparator U3-8, 9, 10 of a comparison circuit 26, and the voltages on the capacitors C6 and C5 are compared in comparators U2-8, 9, 10 and U2-5, 6, 7. The comparators each identify a particular fault.

The comparator U3-8, 9, 10 identifies an open circuit. This comparator compares a current positive peak on the capacitor C3 (at U3-10) with a potential greater than the average peak on the capacitor C4 by the potential developed across a resistor R9, which is part of a voltage divider comprised of resistors R9 and R10. The potential on the capacitor C4 is applied through a follower amplifier U3-12, 13, 14 and added to the potential across the resistor R9 as the input on U3-9. When the current peak (at U3-10) is greater than average by at least the offset across resistor the R9, the output U3-8 goes high, indicating a relatively large inverse peak and, hence, an open circuit. The offset potential across the resistor R9 may be determined empirically so as to permit some deviation from average without making a decision that there is an open circuit. Small deviations are inherent, even when all is well.

The comparator U2-8, 9, 10 identifies a fouled spark plug. This comparator compares a current negative peak on the capacitor C6 with essentially a fixed reference potential. The current negative peak on the capacitor C6 is applied through a follower amplifier U3-1, 2, 3 to U2-10. The reference voltage with which it is compared is developed on a voltage divider R15-R16 connected across a diode D10 and applied to U2-9. When the current negative peak is so small as to be less than the voltage developed across the resistor R16, the output U2-8 goes high, indicating a small output voltage from the ignition coil and, hence, a fouled spark plug. In this particular embodiment, the average negative peak signal as developed on the capacitor C5 is applied through a follower amplifier U3-5, 6, 7 to the reference network D10, R14, R15 and R16. This gradually raises the reference voltage at start up before the average signal is fully developed on the capacitor C5. This effectively keeps the comparator U2-8, 9, 10 turned off at the outset so as not to call a spark plug fouled when the reason the signal is too low is because the engine is not yet operating and hence there is no current signal on the capacitor C6.

The comparator U2-5, 6, 7 identifies a high resistance as may be occasioned by a spark plug with an excessively wide gap. This comparator acts in a manner similar to the comparator U3-8, 9, 10 to compare a current negative peak on the capacitor C6 (by way of the follower amplifier U3-1, 2, 3 to input U2-6) with a potential greater in its deviation from mid-voltage level (6.2v.) than the average negative peak on the capacitor C5 by the potential developed across a resistor R17. The resistor R17 is part of a voltage divider comprised of resistor R17 and R18. The potential on the capacitor C5 is applied through the follower amplifier U3-5, 6 7 and added to the potential across the resistor R17 as the input on U2-5. When the current peak (at U2-6) is greater (in the negative direction from the mid-voltage) than the average by at least the offset across the resistor R17, the output U2-7 goes high, indicating a relatively large negative peak and, hence, a high resistance as may be occasioned by a wide spark plug gap.

The outputs of the respective comparators are applied to respective input terminals of latches in the form of D flip-flops U6 (which may be a guad D flip-flip of type CD40175BE) of a serial to parallel converter 28. The respective outputs of the latches U6 are applied to the display 16 to operate respective LED's there D15, D14 and D16, of which only the operating circuit for the diode D15 is shown in detail, the others being similar. Thus, diode D15 indicates an open circuit, diode D14 indicates a fouled spark plug and diode D16 indicates a high resistance, or wide gap. The outputs of the comparators are also applied to an OR gate formed by diodes D8, D11 and D12 which applies a signal to the Data A input terminal of a shift register U7 (which may be as shown of type CD4015BE). As will be described further below, the shift register U7 acts to identify the faulty spark plug.

For identifying the faulty spark plug and controlling the timing of the various components of the circuit, timing signals are developed from the pulses from the input conditioning circuit 20. Such signals are applied to a discriminator U2-12, 13, 14 of a detector circuit 30. When the negative excursion of the output of the input conditioning circuit 20 goes below the discrimination level set by a voltage divider R20-R21, the output signal at U2-14 goes low, acting to set a flip-flop U5-1, 2, 3, 4, 5, 6 to provide a high output signal on the output terminal U5-3. The output signal is applied on a line 31 to the display 16 to illuminate a diode D21 to indicate operation of the induction coil.

The output of the detector circuit 30 is also applied to a phase-locked loop U8 (which may as shown be of type CD4046BE) of a timing control circuit 32. The phase-locked loop U8 includes a voltage controlled oscillator and when connected as shown to a decade counter U12 (which may as shown be of the type CD4017BE) provides output pulses at 10 times the frequency of the input signals. Reference to FIG. 3 will show the operation of the timing control circuit 32.

FIG. 3B shows the input signal as applied to the phase-locked loop input U8-14. The oscillator then puts our a series of pulses at U8-4 as shown in FIG. 3A. The decade counter U12 then puts out a signal at U12-3 as shown in FIG. 3B for every 10 pulses applied to its input U12-14 from U8-4. The phase-locked loop U8 oscillates at the frequency at which the tenth output pulse (as indicated at U12-3 and applied to the comparator input U8-3) coincides with the next input pulse, assuring synchronization at 10 times the frequency. The respective output terminals of the decade counter U12 thereupon go high at the respective pulses of FIG. 3A, as shown by FIGS. 3D-3H.

The signals (T2) at time period 2 (FIG. 3D, U12-4) are applied as clock pulses to the latches U6 to latch in the fault data from the comparison circuit 26. Those T2 signals are also applied as clock pulses to the shift register U7 to clock in data identifying the respective spark plugs at fault and to shift the data along the shift register.

Thereafter, the signals (T4) at time period 4 (FIG. 3E, U12-10) are applied to switches U4-10, 11, 12 and U4-3, 4, 5 to update the averages on the capacitors C4 and C5. They are also applied to a switch U9-10, 11, 12 to connect the reference signal from the detector 14 to clock data from the shift register U7 into latches in the form of D flip-flops U10 and U11 (which may also be as shown quad D flip-flops of type CD40175BE) in the serial to parallel converter 28. The effect of this is to clock data from the shift register U7 when the last pulse received was a reference pulse occasioned by firing of the spark plug in the reference cylinder. This places the parallel output signals in the latches U10 and U11 in synchronism with the engine cycle so that diodes D17-D20 and D22-D25 correspond to particular respective spark plugs. If no faults have been detected, none of the LED's D17-D20 and D22-D25 will be illuminated. If a fault has been detected in a particular portion of the secondary circuit, the appropriate LED will turn on, indicating the place in the spark plug firing order at which the fault has been detected. With this information, the fault may be located and repaired, LED's D15, D14 and D16 indicating the type of fault.

The output pulses (T5) at the period 5 (FIG. 3F, U12-1) are applied to switches U9-1, 2, 13 and U9-6, 8, 9 to close them momentarily. The switch U9-1, 2, 13 resets the flip-flop U5-1, 2, 3, 4, 5, 6, and the switch U9-6, 8, 9 resets the shift register U7 if the output of the reference flip-flop U5-8, 9, 10, 11, 12, 13 is high, which occurs when a data reading has just been made in the preceding period 4. If the reference flip-flop output is low, the data will not be read out, and the shift register U7 will continue collecting data. The shift register reset function synchronizes the LED outputs irrespective of the number of cylinders (not exceeding 8) and prevents improper accumulation of data in the shift register U7.

The output pulses (T6) at time period 6 (FIG. 3G, U12-5) are applied to a switch U9-3, 4, 5, which resets the reference flip-flop U5-8, 9, 10, 11, 12, 13, if it is set.

The output pulses (T8) at time period 8 (FIG. 3H, U12-9) are applied to switches U4-1, 2, 13 and U4-6, 8, 9, which act to remove the residual charge from the capacitors C6 and C3, respectively, in anticipation of the next voltage reading from the pickup, as previously discussed.

The preferred embodiment of the invention as shown and described displays the location of faulty portions of the secondary circuit (the particular spark plugs) and each type of defect which is detected, without necessarily relating the type of defect to the respective spark plug. Thus, if more than one spark plug is faulty, the type of defect in each plug will not be identified. The circuit could be modified, however, to provide three indicators for each spark plug to show the type of defect at each. Also, the circuit which displays the types of defects could be eliminated, if desired, to reduce cost. Such modifications should be apparent to those skilled in the art having an understanding of the circuit just described.

The various operating voltages may be derived in a conventional manner. As shown, the voltages are derived by a power supply 34 from the usual 12 v. automobile battery to produce three voltages.

$V_1 = +11$ v.
$V_2 = +6.2$ v.
$V_3 = +V = 12$ v.

The many advantages of this invention are now apparent. The location of faults in the ignition secondary circuit may be identified, in addition to the types of faults detected. The analyzer may be portable or hand-held, and the entire secondary circuit may be analyzed without moving a connector from spark plug wire to spark plug wire.

While in the foregoing specification this invention has been described in relation to certain preferred embodiments thereof, and many details have been set forth for the purpose of illustration, it will be apparent to those skilled in the art that the invention is susceptible to additional embodiments and that certain of the details described herein can be varied considerably without departing from the basic principles of the invention.

What is claimed is:

1. Apparatus for analyzing the secondary ignition circuit of a spark ignited internal combustion engine to identify the location of faulty portions of the circuit, said circuit having induction coil means for generating sparking voltage pulses repetitively, and distributor means for cyclically distributing said voltage pulses to respective spark plugs in a predetermined order, said apparatus comprising:
   measuring means coupled to said secondary ignition circuit for producing measurement signals indicating the amplitude of respective voltage pulses of one polarity developed at a single point in said secondary ignition circuit for respective spark plugs in each engine cycle,
   integrating means responsive to said measurement signals for producing a comparison signal indicating the average measurement signals developed for all spark plugs,
   offset means for producing an offset signal,
   comparator means for comparing successive measurement signals with said comparison signal and producing a fault signal when a said measurement signal differs from said comparison signal by more than said offset signal, and
   indicating means responsive to a said fault signal for indicating a fault.

2. Apparatus for analyzing the secondary ignition circuit of a spark ignited internal combustion engine to identify the location of faulty portions of the circuit, said circuit having induction coil means for generating sparking voltage pulses repetitively, and distributor means for cyclically distributing said voltage pulses to respective spark plugs in a predetermined order, said apparatus comprising:
   measuring means coupled to said secondary ignition circuit for producing measurement signals identifying the peak amplitude of respective voltage pulses of one polarity developed at a single point in said secondary ignition circuit for respective said spark plugs in each engine cycle,
   integrating means coupled to said secondary ignition circuit for producing a comparison signal identifying the average peak amplitude of voltage pulses of said one polarity developed for all said spark plugs,
   offset means for producing an offset signal,
   comparator means for comparing successive measurement signals with said comparison signal and producing a fault signal when a said measurement signal differs from said comparison signal by more than said offset signal, and
   indicating means responsive to a said fault signal for indicating a fault.

3. Apparatus according to claim 2 further including threshold means coupled to said secondary ignition circuit for producing a fault signal when said peak amplitude of voltage pulses of said one polarity for a respective spark plug in an engine cycle is less than a predetermined amplitude.

4. Apparatus according to claim 3 further including
   second measuring means coupled to said secondary ignition circuit for producing second measurement signals indicating the peak amplitude of respective voltage pulses of polarity opposite said one polarity developed at said single point in respect to respective said spark plugs in each engine cycle,
   second integrating means coupled to said secondary ignition circuit for producing a second comparison signal indicating the average peak amplitude of voltage pulses of said opposite polarity developed in respect to all said spark plugs,
   second offset means for producing a second offset signal, and
   second comparator means for comparing successive second measurement signals with said second comparison signal and producing a fault signal when a said second measurement signal differs from said second comparison signal by more than said second offset signal.

5. Apparatus according to claim 4 wherein said indicating means includes
   synchronized means responsive to a said fault signal for indicating the spark plug in respect to which said fault signal is produced.

6. Apparatus according to claim 5 wherein said indicating means comprises
   display means coupled to said comparator means, said threshold means and said second comparator means for indicating from which of the three said fault signal arose and thereby indicating the nature of the corresponding fault.

7. Apparatus according to claim 6 wherein
   said measuring means comprises diode means for passing signal pulses corresponding to said one polarity, first capacitance means for storing the signals passing said diode means, and discharge means operable when enabled for discharging said capacitance means, and
   said integrating means comprises second capacitance means of substantially greater capacitance than said first capacitance means, and equalizing means operable when enabled for momentarily coupling said second capacitance means to said first capacitance means for equalizing the signals stored in each, and said apparatus further includes timing means for sequentially enabling said indicating means, said equalizing means, and said discharge means.

8. Apparatus according to claim 3 where in said indicating means includes
synchronized means responsive to a said fault signal for indicating the spark plug in respect to which said fault signal is produced.

9. Apparatus according to claim 8 wherein said indicating means comprises
display means coupled to said comparator means, and said threshold means for indicating from which of the two said fault signal arose and thereby indicating the nature of the corresponding fault.

10. Apparatus according to claim 9 wherein
said measuring means comprises diode means for passing signal pulses corresponding to said one polarity, first capacitance means for storing the signals passing said diode means, and dicharge means operable when enabled for discharging said capacitance means, and
said integrating means comprises second capacitance means of substantially greater capacitance than said first capacitance means, and equalizing means operable when enabled for momentarily coupling said second capacitance means to said first capacitance means for equalizing the signals stored in each, and
said apparatus further includes timing means for sequentially enabling said indicating means, said equalizing means, and said discharge means.

11. Apparatus according to claim 2 wherein said indicating means includes
synchronized means responsive to a said fault signal for indicaing the spark plug in respect to which said fault signal is produced.

12. Apparatus according to claim 4 wherein
said measuring means comprises diode means for passing signal pulses corresponding to said one polarity, first capacitance means for storing the signals passing said diode means, and discharge means operable when enabled for discharging said capacitance means, and
said integrating means comprises second capacitance means of substantially greater capacitance than said first capacitance means, and equalizing means operable when enabled for momentarily coupling said second capacitance means to said first capacitance means for equalizing the signals stored in each, and
said apparatus further includes timing means for sequentially enabling said indicating means, said equalizing means, and said discharge means.

13. Apparatus according to claim 2 wherein
said measuring means comprises diode means for passing signal pulses corresponding to said one polarity, first capacitance means for storing the signals passing said diode means and discharge means operable when enabled for discharging said capacitance means, and
said integrating means comprises second capacitance means of substantially greater capacitance than said first capacitance means, and equalizing means operable when enabled for momentarily coupling said second capacitance means to said first capacitance means for equalizing the signals stored in each, and
said apparatus further includes timing means for sequentially enabling said indicating means, said equalizing means, and said discharge means.

14. Apparatus according to claim 2 further including
second measuring means coupled to said secondary ignition circuit for producing second measurement signals indicating the peak amplitude of respective voltage pulses of polarity opposite said one polarity developed at said single point in respect to respective said spark plugs in each engine cycle,
second integrating means coupled to said secondary ignition circuit for producing a second comparison signal indicating the average peak amplitude of voltage pulses of said opposite polarity developed in respect to all said spark plugs,
second offset means for producing a second offset signal, and
second comparator means for comparing successive second measurement signals with said second comparison signal and producing a fault signal when a said second measurement signal differs from said second comparison signal by more than said second offset signal.

15. Apparatus according to claim 14 wherein said indicating means includes
synchronized means responsive to a said fault signal for indicating the spark plug in respect to which said fault signal is produced.

16. A method for analyzing the secondary ignition circuit of an internal combustion engine to identify the location of faulty portions of the circuit, said circuit having means for generating a succession of high voltage outputs from a coil, and means for distributing said outputs to a plurality of portions of said circuit in a predetermined order, each said portion including a spark plug, said method comprising:
measuring the voltage of each output of said coil;
storing a first reference voltage which is indicating the average of the positive components of said measured output voltages;
storing a second reference voltage which is indicating the average of the negative components of said measured output voltages;
comparing each successive measurement of the output of said coil with said reference voltages and generating data to identify faults in said circuit if the positive component of said output exceeds said first reference voltage by a predetermined differential, if the negative component of said output exceeds said second reference voltage by a predetermined differential, or if the negative component of said output is less than a predetermined amplitude;
identifying the portion of said circuit to which each said output is distributed; and
displaying said data to identify the location of any faulty portions detected by said comparing means.

17. The method of claim 16 comprising analyzing each said output to identify the type of fault detected, if any, and displaying the types of faults identified.

18. A method for analyzing the secondary ignition circuit of a spark ignited internal combustion engine to identify the location of faulty portions of the circuit, said circuit having induction coil means for generating sparking voltage pulses repetitively, and distributor means for cyclically distributing said voltage pulses to respective spark plugs in a predetermined order, said method comprising:
measuring the amplitude of respective voltage pulses of one polarity developed at a single point in said secondary ignition circuit for respective spark plugs in each engine cycle and producing measurement signals indicating said amplitudes, deriving a comparison signal indicating the average measurement signals developed for all spark plugs, comparing successive measurement signals with said comparison signal, and indicating a fault when a said measurement signal differs from said comparison signal by more than a predetermined differential.

19. A method for analyzing the secondary ignition circuit of a spark ignited internal combustion engine to identify the location of faulty portions of the circuit, said circuit having induction coil means for generating sparking voltage pulses repetitively, and distributor means for cyclically distributing said voltage pulses to respective spark plugs in a predetermined order, said method comprising:

measuring the peak amplitude of respective voltage pulses of one polarity developed at a single point in said secondary ignition circuit for respective said spark plugs in each engine cycle and producing measurement signals indicating said amplitudes, deriving a comparison signal indicating the average peak amplitude of voltage pulses of said one polarity developed for all said spark plugs, comparing successive measurement signals with said comparison signal, and indicating a fault when a said measurement signal differs from said comparison signal by more than a predetermined differential.

20. A method according to claim 19 further comprising indicating a fault when said peak amplitude of voltage pulses of said one polarity for a respective spark plug in an engine cycle is less than a predetermined amplitude.

21. A method according to claim 20 further comprising measuring the peak amplitude of respective voltage pulses of polarity opposite said one polarity developed at said single point in respect to respective said spark plugs in each engine cycle and producing second measurement signals indicating the last-mentioned peak amplitudes, deriving a second comparison signal indicating the average peak amplitude in respect to all said spark plugs, comparing successive second measurement signals with said second comparison signal, and indicating a fault when a said second measurement signal differs from said second comparison signal by more than a predetermined differential.

22. A method according to claim 21 further including indicating the spark plug in respect to which a fault is indicated.

23. A method according to claim 22 further including indicating the nature of an indicated fault.

24. A method according to claim 19 further comprising measuring the peak amplitude of respective voltage pulses of polarity opposite said one polarity developed at said single point in respect to respective said spark plugs in each engine cycle and producing second measurement signals indicating the last-mentioned peak amplitudes, comparing successive second measurement signals with said second comparison signal, and indicating a fault when a said second measurement signal differs from said second comparison signal by more than a predetermined differential.

25. A method according to claim 24 further including indicating the spark plug in respect to which a fault is indicated.

26. A method according to claim 25 further including indicating the nature of an indicated fault.

27. A method according to claim 20 further including indicating the spark plug in respect to which a fault is indicated.

28. A method according to claim 27 further including indicating the nature of an indicated fault.

29. A method according to claim 19 further including indicating the spark plug in respect to which a fault is indicated.

* * * * *

UNITED STATES PATENT AND TRADEMARK OFFICE
CERTIFICATE OF CORRECTION

PATENT NO. : 4,558,280

DATED : December 10, 1985

INVENTOR(S) : Steven E. Koehl et al.

It is certified that error appears in the above-identified patent and that said Letters Patent is hereby corrected as shown below: On the title page:

Inventor's name should be --Steven E. Koehl-- rather than "Stephen E. Koehl".

Column 1, line 18, change "measuement" to --measurement--.

Column 1, line 19, change "to" to --the--.

Column 2, line 30, second occurrence, change "an" to --a--.

Column 3, line 43, change "voltage" to --voltages--.

Column 4, line 14, change "serval" to --several--.

Column 4, line 46, change "resistor the" to --the resistor--.

Column 5, line 19, after "6" insert --,--.

Column 5, line 29, change "flip-flip" to --flip-flop--.

Column 5, line 32, change "there" to --thereof--.

Column 5, line 68, change "our" to --out--.

Column 9, line 4, change "where in" to --wherein--.

Column 9, line 34, change "indicaing" to --indicating--.

Signed and Sealed this

Twenty-second Day of April 1986

[SEAL]

Attest:

DONALD J. QUIGG

Attesting Officer

Commissioner of Patents and Trademarks